(12) United States Patent
Rice

(10) Patent No.: US 9,270,039 B2
(45) Date of Patent: Feb. 23, 2016

(54) SURFACE MOUNT CONNECTOR FOR ELECTRICALLY ISOLATING TWO INSULATED CONDUCTORS

(71) Applicant: Zierick Manufacturing Corporation, Mount Kisco, NY (US)

(72) Inventor: Daniel Rice, Tarrytown, NY (US)

(73) Assignee: Zierick Manufacturing Corporation, Mount Kisco, NY (US)

(*) Notice: Subject to any disclaimer, the term of this patent is extended or adjusted under 35 U.S.C. 154(b) by 171 days.

(21) Appl. No.: 14/012,510

(22) Filed: Aug. 28, 2013

(65) Prior Publication Data

US 2014/0060929 A1   Mar. 6, 2014

Related U.S. Application Data

(60) Provisional application No. 61/693,845, filed on Aug. 28, 2012.

(51) Int. Cl.
| | |
|---|---|
| H01R 4/20 | (2006.01) |
| H01R 11/16 | (2006.01) |
| H01R 12/71 | (2011.01) |
| H05K 3/30 | (2006.01) |
| H01R 4/24 | (2006.01) |
| H01R 12/57 | (2011.01) |
| H05K 3/32 | (2006.01) |

(52) U.S. Cl.
CPC .............. *H01R 11/16* (2013.01); *H01R 4/242* (2013.01); *H01R 12/57* (2013.01); *H01R 12/712* (2013.01); *H05K 3/30* (2013.01); *H05K 3/32* (2013.01); *H05K 2201/1031* (2013.01); *H05K 2201/10356* (2013.01); *H05K 2201/10962* (2013.01); *Y10T 29/5327* (2015.01)

(58) Field of Classification Search
CPC .......... H01R 4/20; H01R 4/24; H01R 4/2404; H01R 4/2416; H05K 2201/10303
USPC ......................................... 174/84 C; 439/404
See application file for complete search history.

(56) References Cited

U.S. PATENT DOCUMENTS

| | | | | | |
|---|---|---|---|---|---|
| 3,924,923 | A | * | 12/1975 | Shoemaker | 439/894 |
| 4,046,446 | A | * | 9/1977 | Reavis, Jr. | 439/401 |
| 6,264,510 | B1 | * | 7/2001 | Onizuka et al. | 439/876 |
| 7,040,914 | B2 | * | 5/2006 | Kuwayama et al. | 439/422 |
| 7,309,252 | B2 | * | 12/2007 | Fabian et al. | 439/404 |

* cited by examiner

*Primary Examiner* — Chau N Nguyen
(74) *Attorney, Agent, or Firm* — Myron Greenspan; Lackenbach Siegel LLP

(57) ABSTRACT

A surface mount connector includes a pair of electrical contacts spaced from each other a predetermined distance. Each contact includes a substantially flat base portion having upper and lower surfaces, the lower surface being suitable for soldering to a pad or land on a printed circuit board (PCB). Each contact is provided with an integrally-formed conductor-engaging portion extending from a base portion in a direction substantially normal to the base portion. Electrically non-conductive tape is secured to the upper surfaces of the spaced base portions for maintaining the contacts spaced at a set or predetermined distance from each other. The contacts each including member for physically and electrically engaging another insulated conductor so that the connector can physically and electrically engage and secure two separate insulated or clad conductors while maintaining them electrically isolated.

10 Claims, 8 Drawing Sheets

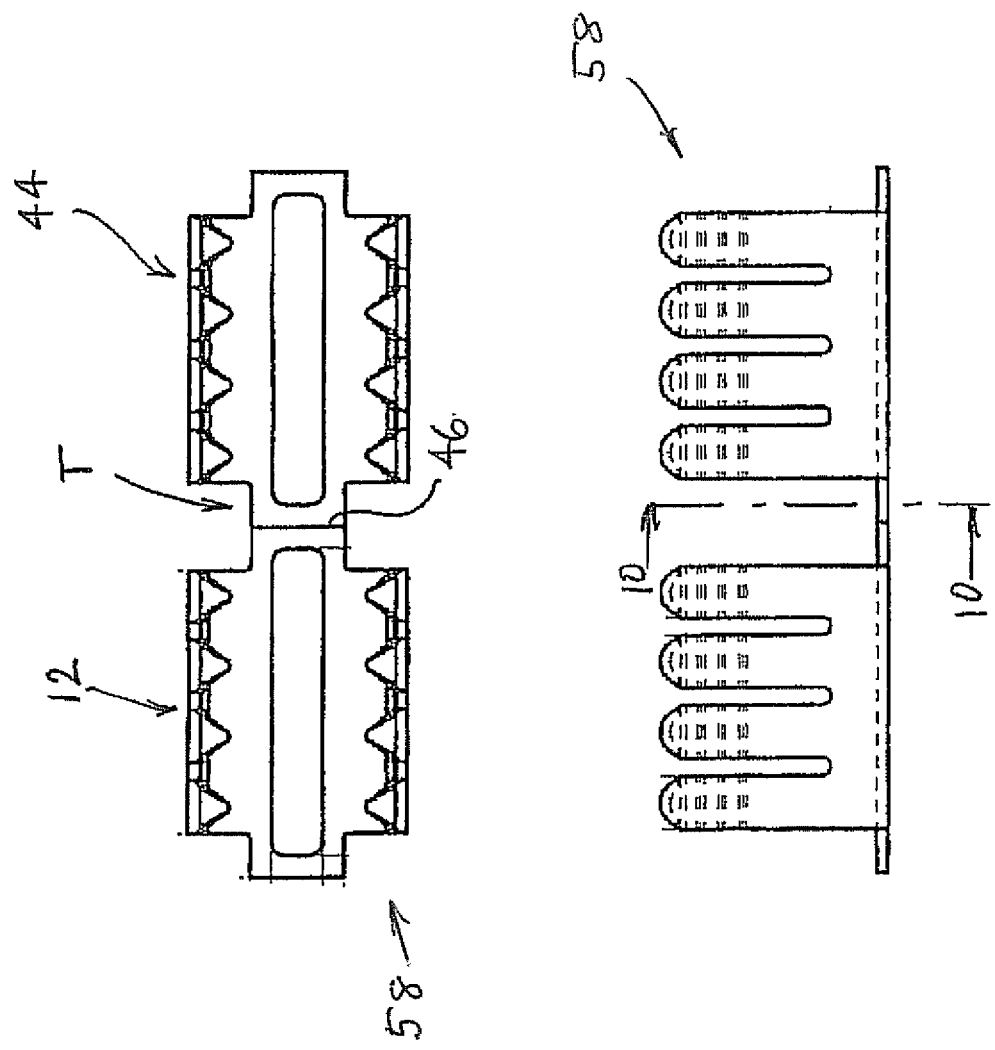

SURFACE MOUNT CONNECTOR FOR ELECTRICALLY ISOLATING TWO INSULATED CONDUCTORS

BACKGROUND OF THE INVENTION

1. Field of the Invention

The invention generally relates to surface mount connectors and, more specifically, to a surface mount connector for electrically isolating two insulated conductors.

2. Description of the Prior Art

Manufactures want to be able to use zipcord and attach the same to a printed circuit board (PCB), zipcords being inexpensive cables of two insulated wires bonded together along their length. To make a functional surface mount zipcord connector several technical problems need to be solved. The connector needs to be capable of piercing the insulation and make good connection with both internal wires or conductors while causing damage to a minimum number of wire strands. The connector also needs to provide strain relieve to hold the wire securely. Additionally, the connector needs to be capable of being mounted on a PCB easily and crimped in one action. Preferably, such connectors do not require preparation of the zipcord prior to termination.

U.S. Pat. No. 2,680,235 is for an "Electrical Connector" for terminating a conductor and includes opposing ears that form barbs that are suitable for piercing the insulation and making contact with a central conductor. However, this patent teaches a connector for a single conductor, not a zipcord and there is no suggestion that the electrical connector can or should be surface mounted.

U.S. Pat. No. 6,461,188 to Reul is for a "Solderable Electrical Connection Element with a Solder Deposit". The patent teaches attachment of conducting track or metal conductors by means of a soldered joint that can be made using a solder deposit.

An "Insulation Displacement Connector (IDC)" is disclosed in U.S. Pat. Nos. 7,833,045 and 7,955,116 to Bishop. These patents are designed to connect one or more insulated wires to a component such as a printed circuit board. However, the receptacle for each of the wires is separated by a surface 22 that would prevent its use with a standard zipcord without first splitting the cord into two individual conductors. These patents disclose a plurality of generally standard IDC connectors arranged in tandem to receive as few or as many individual conductors.

SUMMARY OF THE INVENTION

Accordingly, it is an object of the present invention to provide a surface mount connector for securing a zipcord or any two insulated conductors while electrically isolating them that does not possess the disadvantages inherent in prior art connectors.

It is another object of the present invention to provide a surface mount connector as in the previous object that is simple in construction and economical to manufacture.

It still another object of the present invention to provide a surface mount as aforementioned connector that can be easily and efficiently surface mounted by a pick-and-place machine.

It is yet another object of the present invention to provide a surface mount connector as suggested in the previous objects that maintains the individual conductors for each of the zipcord wires at predetermined desired spacings from each other suitable for surface mounting on fixed lands or pads on a PCB.

It is a further object of the present invention to provide a surface mount connector of the type under discussion that can be placed on a PCB easily in one action.

It is still another object of the present invention to provide a surface mount connector as in the previous objects that does not require pretreatment for the wires.

It is yet a further object of the present invention to provide a surface mount connector that allows the insulated wires to continue beyond the connector for further termination in parallel on the same circuit board.

It is an additional object of the present invention to provide a surface mount connector as in the previous objects that provides good electrical and mechanical contact with the wires of the zipcord with minimal damage to the wires strands within the conductors.

It is also an additional object of the present invention to provide a surface mount connector as in the previous object that provides good strain relief to hold the wires securely.

It is yet an additional object to provide a simple and convenient method of closing a surface mount connector as in the previous objects to make electrical contact with one or both conductors of a zipcord.

In order to achieve the above and other objects a surface mount connector comprises a pair of electrical contacts spaced from each other a predetermined distance. Each contact comprising a substantially flat base portion having upper and lower surfaces, said lower surface being suitable for soldering to a pad or land on a printed circuit board (PCB). Each contact is provided with an integrally-formed conductor-engaging portion extending from a base portion in a direction substantially normal to said base portion. Electrically non-conductive tape is secured to said upper surface of said spaced base portions for maintaining said contacts spaced at a set predetermined distance from each other. Said contacts each includes means, such as piercing fingers or keyhole openings, for physically and electrically engaging another insulated conductor, whereby the connector can physically and electrically engage and secure two separate insulated or clad conductors while maintaining them electrically isolated.

BRIEF DESCRIPTION OF THE DRAWINGS

Those skilled in the art will appreciate the improvements and advantages that derive from the present invention upon reading the following detailed description, claims, and drawings, in which:

FIG. 8 is an embodiment of the invention in which a strip of surface mount zipcord connectors are formed adjacent ones of which are connected to each other by means of connecting tabs;

FIG. 9 is a side elevational view of the tab-connected connector shown in FIG. 8;

DESCRIPTION OF PREFERRED EMBODIMENT

Figure 1:
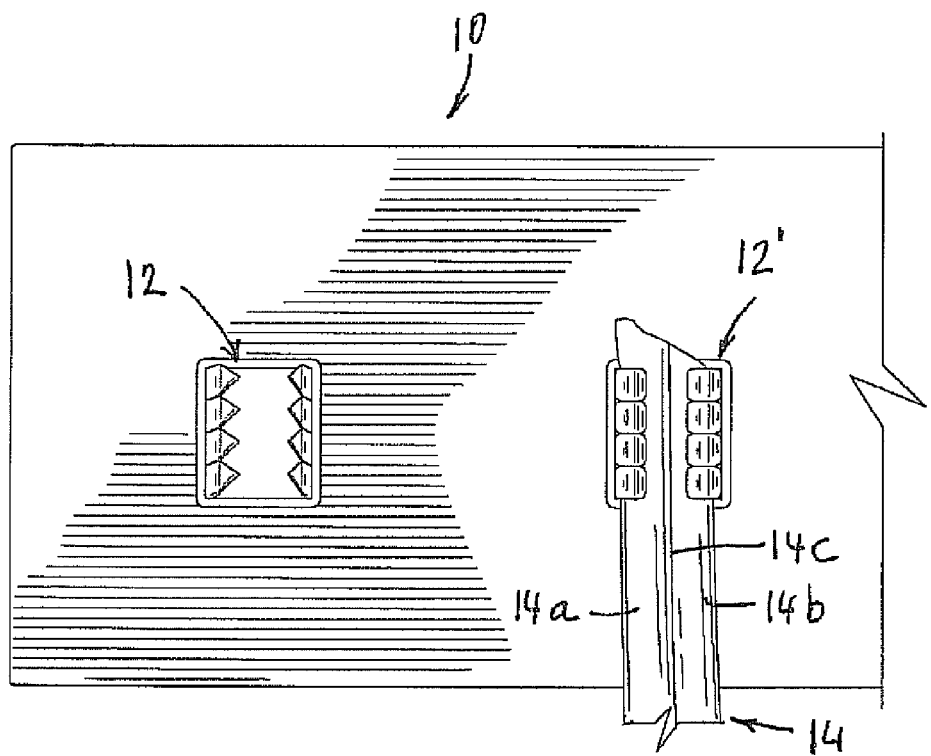
FIG. 1 is a top plan view of a printed circuit board on which there are mounted two surface mount zipcord connectors in accordance with the invention, one prior to receiving a zipcord and the other with a zipcord securely mounted after the fingers of the zipcord have been deformed and have pierced associated wires of the zipcord.

Referring now specifically to the Figures, in which identical or similar parts are designated by the same reference numerals throughout, and first referring to FIG. 1, a printed circuit board (PCB) 10 is illustrated bearing two surface mount zipcord connectors in accordance with the present invention. The first connector 12 is shown in its open condition, prior to receiving a zipcord and a similar second connector 12' is shown with a zipcord 14 received therein for providing good mechanical as well as electrical connection with the conductive strands within the zipcord, as it will be more fully described.

The zipcord 14 is generally a relatively inexpensive cable formed of two insulated conductors 14a, 14b with their insulations bonded together at a thin frangible, rupture or parting line 14c to facilitate, when desired, the separation of the two conductors 14a, 14b from each other by severing or rupturing the zipcord along the relatively weak parting or separation line 14c.

Figure 2:
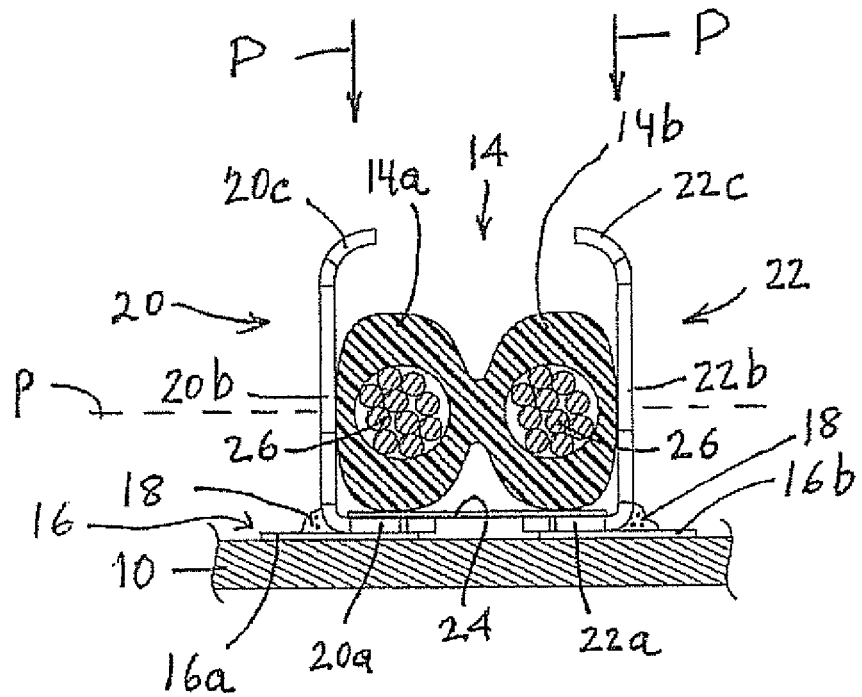
FIG. 2. is a transverse cross section through the surface mount zipcord connector with a zipcord arranged therein prior to deformation of the piercing fingers.
Figure 3:
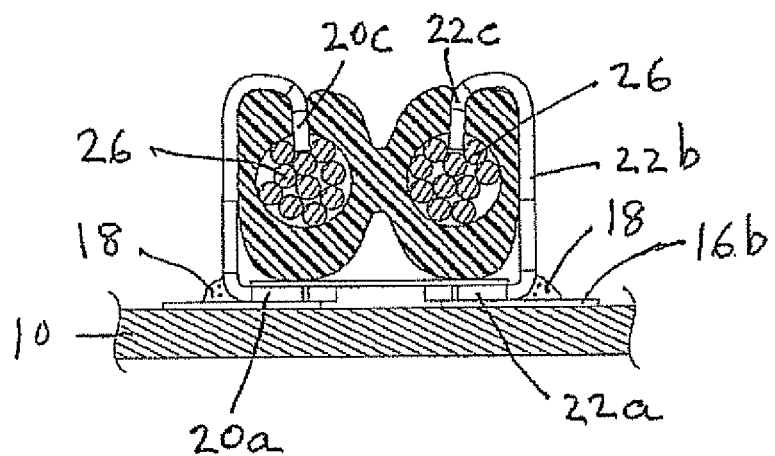
FIG. 3 is similar to FIG. 2 but shown after the piercing fingers have been inwardly deflected to pierce the insulation and conductors in associated zipcord wires.
Figure 7:
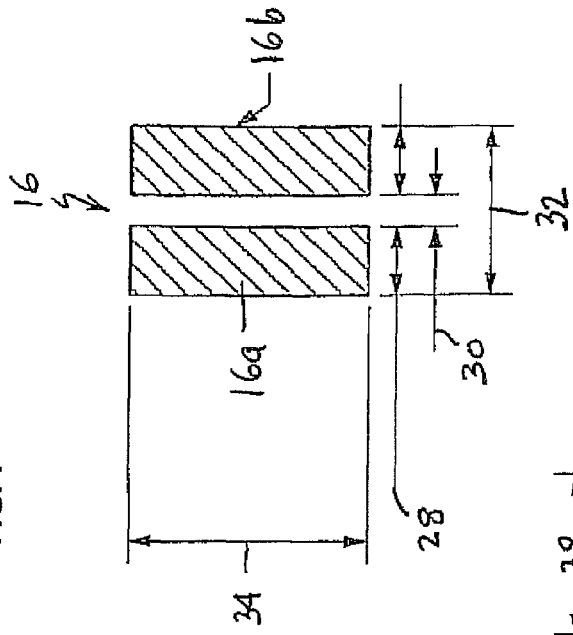
FIG. 7 is a top plan view of a pair of lands or pads of the type that can be formed on a printed circuit board for being attached to the surface mount zipcord connector.
Figure 6:
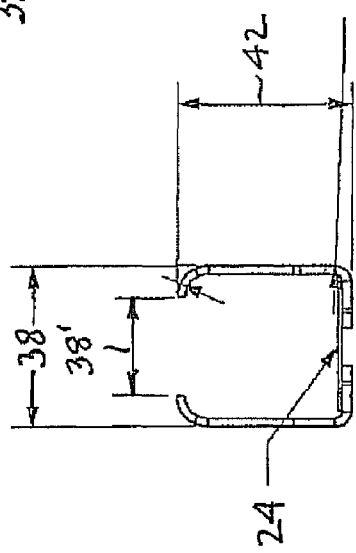
FIG. 6 is a transverse cross sectional view of the connector shown in FIG. 4, taken along the line 6-6.
Figure 4:
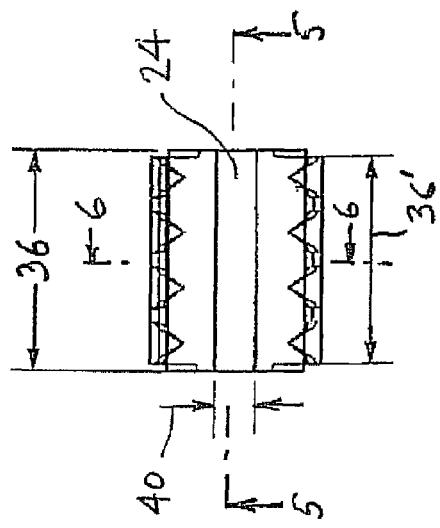
FIG. 4 is a top plan view of a surface mount zipcord connector in accordance with the invention prior to surface mounting.

Referring to FIGS. 2-6, each zipcord connector 12 is dimensioned and configured to be surface mounted on a pair of lands or solder pads 16. The solder pads are formed of two generally rectangular lands or pads 16a, 16b (FIG. 7) that are made of copper and are formed on a PCB in a conventional manner. As shown in FIGS. 2 and 3, the connector 12 is surface mounted on the lands or pads 16a, 16b by means of solder 18 that may be applied in any conventional way such as reflow soldering.

Referring to FIG. 2, each connector 12 is formed of a pair of legs 20, 22 that are spaced from each other a predetermined distance to accommodate the width of the zipcord and to register with the pads or lands 16. The legs 20, 22 include bottom horizontal base portions 20a, 22a, vertical fingers 20b, 22b and upper piercing points or hooks 20c, 22c, respectively. The legs 20, 22 are similarly shaped but oriented to be mirror reflections of each other, as shown.

In order to maintain the desired spacing between the legs 20, 22 a non-conductive tape 24 is applied to the upper surfaces of the bottom horizontal base portions 20a, 22a, as shown. The tape may be any suitable tape. In the present preferred embodiment, the tape 24 is a polyamide tape such as Kapton® tape.

Referring to FIGS. 2-6, the legs 20, 22 are positioned to create a space therebetween sufficient to receive a zipcord 14 in which the individual insulated conductors 14a, 14b are arranged in a plane that is substantially parallel to the bottom base portions 20a, 22a and, therefore, substantially parallel to the PCB 10. The height 42 (FIG. 6) of the connector is selected to position the upper piercing tips or hooks 20c, 22c above the zipcord 14 when the latter is placed into contact with the tape 24 as shown in FIGS. 2 and 3. In this manner, when a suitably configured crimping tool applies a pressure P on each of the legs 20b, 22b, the upper piercing points or hooks 20c, 22c are bent inwardly and forced to pierce the insulation, in a curling action, and enter the space with the internal wire strands 26 to make electrical contact therewith while the fingers provide secure mechanical contact with the external insulation 14a, 14b.

Referring to FIGS. 4-7, the spacing 30 between the rectangular pads or lands 16a, 16b can be 0.045" and the width 32 of the pad footprint is approximately 0.245". The length of the pad footprint 34 is approximately 0.33". To accommodate lengths with the aforementioned dimensions, the length 36 of the zipcord connector 12 approximately equals the dimension 34 as approximately 0.32" at the extreme ends, while the effective length of the connector 36' of the connector is approximately 0.3". The width 38 of the connector is approximately equal to the dimension 32 as approximately 0.234". Spacing or gap 40 between the individual contact fingers is approximately equal to the dimension 38 and equal to approximately 0.055". The height 42 of the contacts is approximately 0.247".

Figure 5:
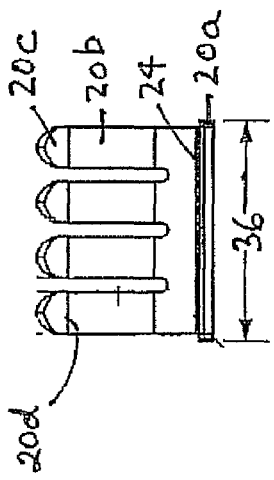
FIG. 5 is a longitudinal cross sectional view of the connector shown in FIG. 4, taken along the line 5-5.

In order to facilitate the suggested curling action, the upper piercing points or hooks 20c, 22c may be provided with V-shaped coins, bends or fold lines 20d (FIG. 5).

Since the zipcord connector 12 is intended to be used as a surface mount (SMT) connector it is preferably made in a form in which a plurality of such connectors may be continuously fed to a pick up station of a pick-and-place machine. In this connection the tape 24 forms a good upper surface for a vacuum nozzle (not shown) of a pick-and-place machine. Also, while the upper piercing points or hooks are inwardly directed, as shown, the minimum spacing 38' between them is 0.144" in the illustrated embodiment, selected to assure adequate space for a vacuum nozzle to penetrate into the space for contact with the tape 24.

Figure 11:
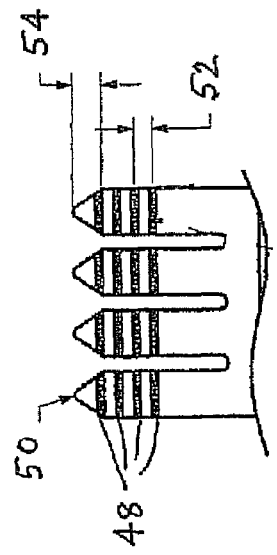
FIG. 11 is a fragmented side elevational view of the fingers forming the connector shown in FIG. 10 as taken along direction A.
Figure 10:
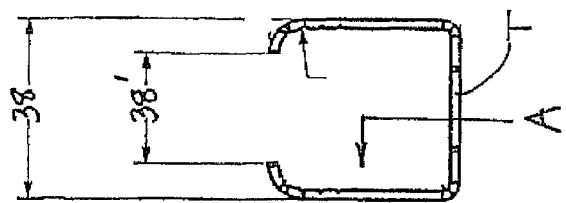
FIG. 10 is a transverse section of the tab-attached connectors shown in FIG. 9 as taken along line 10-10.

Referring to FIG. 11, the upper piercing points or hooks are shown to be provided with a plurality of V-shaped coins 48 that are parallel to each other as shown and spaced from each other a distance 52 that may typically be 0.023". The actual piercing tips 50 of the points or hooks have a height 54 of approximately 0.038".

Figure 12:
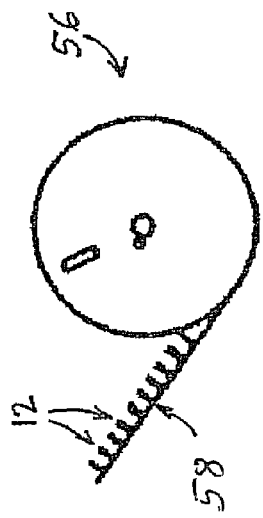
FIG. 12 is a side elevational view of a reel for dispensing tab-attached connectors of the type shown in FIGS. 8 and 9.

In FIG. 12, a strip of connectors 58 is shown coiled about a reel 56 suitable for use of a pick-and-place machine. Referring to FIGS. 8 and 9, adjacent connectors 12 may be connected to each other by intermediate tabs T that have a width to ensure that the tabs are sufficiently flexible to allow the strip 34 to be wound about a reel. A feeding machine can be used to feed successive connectors 12 to a pick up station by severing the endmost connector from the next successive connector at a severance line 46.

Figure 13:
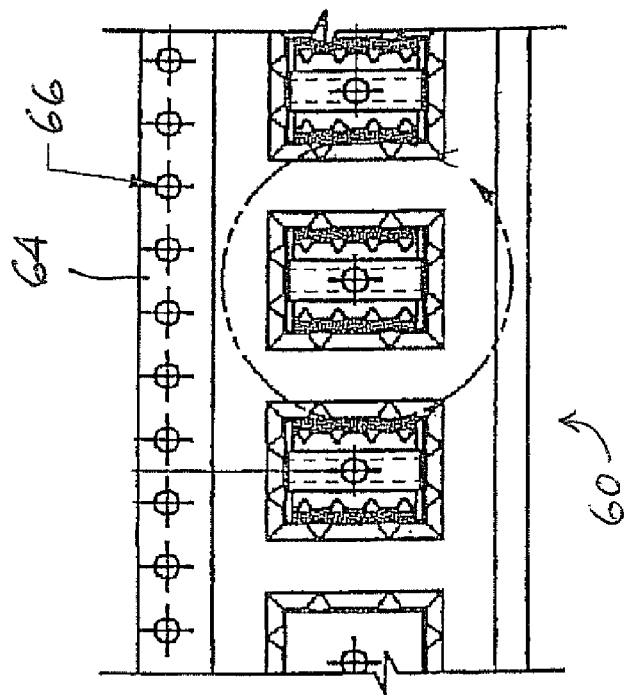
FIG. 13 illustrates another method of dispensing the surface mount zipcord connectors by storing the connectors in pockets on a tape of the type commonly used with pick-and-place machines.
Figure 14:
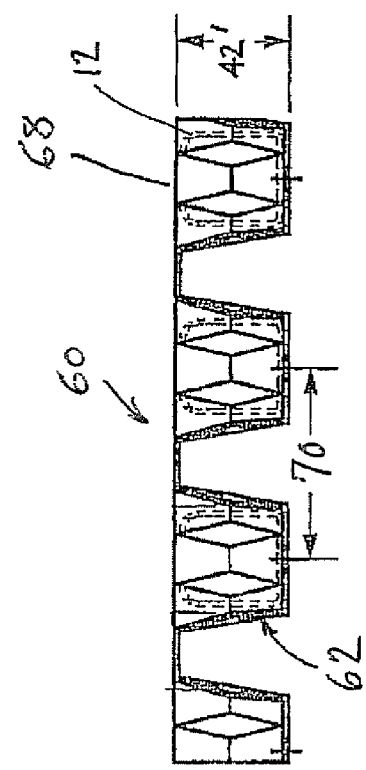
FIG. 14 is a side elevational view of the tape and pockets shown in FIG. 13.
Figure 18:
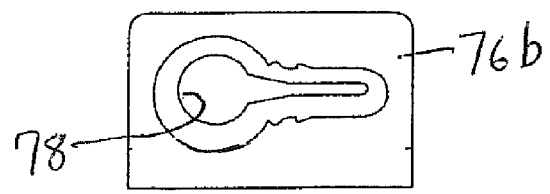
FIG. 18 is a side elevational view of the connector shown in FIGS. 15-17.
Figure 15:
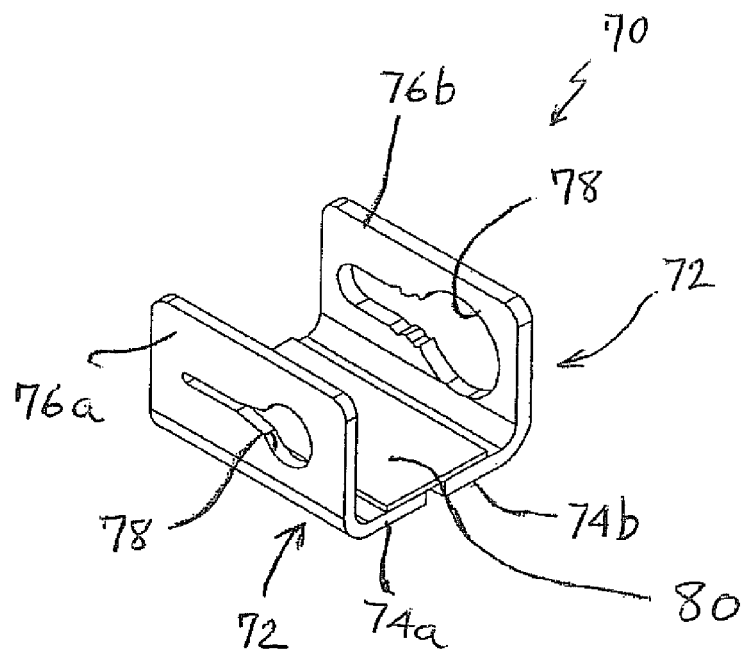
FIG. 15 is a perspective view of a modified form of a surface mount connector embodying the invention.
Figure 16:
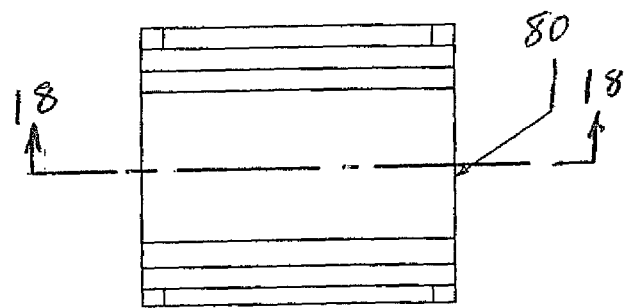
FIG. 16 is a top plan view of the connector shown in FIG. 15.
Figure 17:
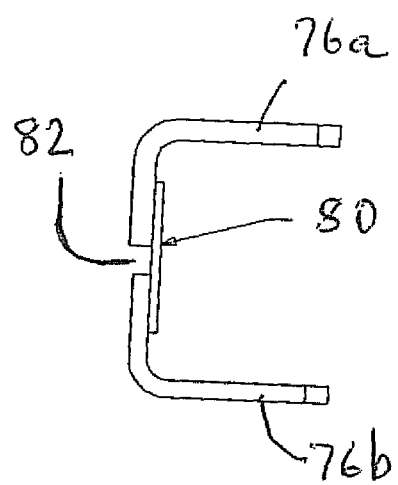
FIG. 17 is an end elevational view of the connector shown in FIGS. 15 and 16.

The zipcord connectors may also be fed to a pick up station by means of continuous tape 60 formed with or carrying pockets 62 each for securely receiving one connector as shown in FIGS. 13 and 14. The tape 60 may be formed of a carbon polystyrene or other suitable material. Only one edge 64 of the tape 60 is provided a series of spaced holes 66 as shown that are 0.16" apart and have a diameter of approximately 0.06". These spaced holes are used to register and accurately maintain the position of individual pockets as they enter the pick-and-place machine in a manner or well known in the art. The individual pockets are initially covered with a suitable removable tape 68 that can be removed prior to pick up and may be a Kapton® tape. The tape can also be any known heat sealed or pressure sensitive tape. The spacing between individual pockets is not critical but in the example shown the spacing 70 is approximately 0.47".

With the construction shown and described, the zipcord connector 12 provides surface mounting with opposing spaced fingers, each set of which is suitable for piercing of an associated connector of a zipcord to make both good mechanical connection with wire and the individual conductor strength inside the insulation while damaging a minimum number of wire strands. The connector 12 provides reliable strength relief to hold the wire securely. A connector 12 can be easily placed on a PCB with one action with no pre-treatment of the wire. The top down curling action provides good strength relief and makes good connection to the strand despite the inconsistent strand positioning within the wire. This curling is assisted by the V-shaped score lines on the row(s) or fingers. This zipcord connector in accordance with the invention also provides electrical insulation between the individual spaced fingers while maintaining this spacing at substantially constant and predictable dimensions to prevent the fingers from floating apart or coming together to make crimping inconsistent. This has been realized in a practical way by using Kapton® tape on the bottom of the part that effectively makes the spaced individual conductive fingers one integrated piece that maintains the desired spacing precisely between the fingers, as well as maintain the outer walls parallel to each other while electrically insulating the two sets of fingers from each other.

The advantages of the zipcord in accordance with the invention allows the rapid and secure termination of a zipcord to a circuit board using surface mount features. It is quicker and more efficient than a process that requires separation of the wires and does not require any preparation of the individual wires prior to termination. The invention also allows the same zipcord wire to continue beyond the connector for further parallel terminations on the same or other PCB's.

Referring to FIGS. 15-18 there is shown a modified form of surface mount connector generally designated by the reference numeral 70. The general form of a keyhole connector is shown and described in the co-pending application Ser. No. 61/735,123 filed on Dec. 10, 2012 by Zierick Manufacturing Corp. The aforementioned application is incorporated as it fully set forth herein. The distinction, as it will be evident, is that in the previously filed application the keyhole connector was an integrally formed connector in which there is electrical continuity throughout the entire connector, including base and both upwardly projecting walls containing the keyhole openings, so that same potential exists at all the wires connected to the connector and so that they are all in electrical contact with one another. Here, the connector 70 includes two separate electrical contacts 72 that are mirror images of each other and include spaced leg portions 74a, 74b to provide a gap 82 and break in electrical conductivity between the two opposing contacts. The upwardly rising wall members 76a, 76b are provided with keyhole openings 78 as described in the co-pending application. However, as discussed previously because there is a gap or space 82 between the individual leg portions 74a, 74b an electrically non-conductive tape 80 is secured to the upper surfaces of the spaced base portions, as shown, for maintaining the contacts 72 together and spaced from each at a set or predetermined distance. In this way, a connector can physically and electrically engage and secure the two separate insulated conductors, as with the previous described embodiment, while maintaining them electrically isolated.

For both embodiments, as well as other surface mount connectors that can be configured in accordance with the present invention, the non-conductive tape 80 may be bonded to substantially the entire upper surfaces of the flat base portions 74a, 74b. The greater the surface area to which a tape is bonded, clearly, the greater will be bond and the stronger the connector will be. For all embodiments, the gap or space 82 (FIG. 17) between the flat base portion 74a, 74b is selected to insure that the solder does not accumulate and bridge access the edges of the two based portions as this would create a conductive path or paths between the base portions and eliminate the electrical isolation that the present invention is intended to provide. Therefore, with wicking and capillary action considerations, the spacing 82 need to be sufficiently large so that the gap will not be filled or fully occupied by solder during the reflow step when the connector is soldered to a PCB board.

The non-conductive tape 80, consistent with the previous discussion needs to be able to withstand the high temperatures during reflow soldering of the base portions to a PCB without the tape being damaged or the bonds between the tape and the electrical contacts compromised. Also as shown, the tape 80 is provided at the upper surface thereof with a flat generally smooth surface suitable for mating with a vacuum nozzle of a pick and place machine.

While the gap 82 may be enlarged to avoid bridging by solder, the gap or spacing 82 may also be determined by the real estate limitations on the PCB board as well as the flexibility of the tape 80. The tape, for a selected gap 82, should be sufficiently rigid to maintain the physical configuration of the surface mount connector 70 while picked up, moved and deposited on a PCB so that it is, effectively, a relatively rigid member suitable for automatic placement by a pick-and-place machine.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

The invention claimed is:

1. A surface mount connector for physically receiving and for electrically contacting a pair of adjacent insulated conductors comprising a pair of electrical contacts spaced from each other a predetermined distance;

each contact comprising a substantially flat base portion having upper and lower surfaces, said lower surface being suitable for soldering to a pad or land on a printed circuit board (PCB), each contact being provided with an integrally-formed conductor-engaging portion extending from said base portion in a direction substantially normal to said base portion to form a space for receiving the adjacent insulated conductors above said base portions and between said conductor engaging portions;

electrically non-conductive tape secured to said upper surface of said spaced base portions for maintaining said contacts spaced at said predetermined distance from each other to generally maintain the dimensions of said space while electrically isolating said contacts, said contacts each including means for physically and electrically engaging another insulated conductor, whereby the connector can physically and electrically engage and secure two separate insulated conductors while maintaining them electrically isolated.

2. A surface mount connector as defined in claim 1, wherein said conductor engaging contacts comprise two rows each having a plurality of fingers the free ends of which are inwardly directed to crimp and curl inwardly when pressed by a suitable tool to pierce insulation of an insulated conductor placed on said flat base portions.

3. A surface mount connector as defined in claim 1, wherein said conductor engaging portions include a keyhole opening for engaging and securing an insulated conductor placed within said keyhole opening electrically isolated from said conductor engaging portions.

4. A surface mount connector as defined in claim 1, wherein said non-conductive tape is adhesively bonded to said flat base portions.

5. A surface mount connector as defined in claim 4, wherein said non-conductive tape is bonded to substantially the entire upper surfaces of said flat base portions.

6. A surface mount connector as defined in claim 1, wherein said electrically non-conductive tape can withstand temperatures during reflow soldering of said base portions to a PCB.

7. A surface mount connector as defined in claim 1, wherein said electrically non-conductive tape is a polyamide tape.

8. A surface mount connector as defined in claim 1, wherein said non-conductive tape is provided with an upper surface when bonded to said base portions suitable for mating with a vacuum nozzle of a pick and place machine.

9. A surface mount connector as defined in claim 1, wherein said non-conductive tape is sufficiently rigid to maintain the physical configuration of the surface mount connector when picked up, moved and deposited on a PCB notwithstanding that said electrical contacts are spaced from each other and only held together by said non-conductive tape.

10. A surface mount connector as defined in claim 1, wherein said base portions are spaced a distance to insure that solder does not bridge between said base portions during reflow soldering and said non-conductive tape has a width greater than said distance.

\* \* \* \* \*